United States Patent [19]

Hiraoka

[11] Patent Number: 4,482,427
[45] Date of Patent: Nov. 13, 1984

[54] PROCESS FOR FORMING VIA HOLES HAVING SLOPED WALLS

[75] Inventor: Hiroyuki Hiraoka, Saratoga, Calif.

[73] Assignee: International Business Machines Corporation, Armonk, N.Y.

[21] Appl. No.: 612,189

[22] Filed: May 21, 1984

[51] Int. Cl.$^3$ .................. B44C 1/22; C03C 15/00; C03C 25/06; B29C 17/08
[52] U.S. Cl. .................................. 156/643; 156/644; 156/646; 156/655; 156/668; 204/192 E
[58] Field of Search ............... 156/643, 644, 646, 655, 156/659.1, 668; 204/192 E, 164; 252/79.1; 427/38, 39

[56] References Cited

U.S. PATENT DOCUMENTS 4,357,203 11/1982 Zelez .............................. 156/668 X

OTHER PUBLICATIONS

Bondur and Clark, "Plasma Etching for SiO$_2$ Profile Control", Solid State Technology, pp. 122, Apr. 1980.

*Primary Examiner*—William A. Powell
*Attorney, Agent, or Firm*—Joseph G. Walsh

[57] ABSTRACT

A dry process for forming via holes with sloped walls by oxygen reactive ion etching through a perforated mask.

6 Claims, No Drawings

PROCESS FOR FORMING VIA HOLES HAVING SLOPED WALLS

DESCRIPTION

1. Technical Field

The present invention is concerned with a process for forming via holes having sloped sidewalls. The process is a completely dry one.

2. Background Art

In most lithographic etching processes it is desired to have vertical walls resulting. An exception to this is in the case of via holes, where it is now recognized that it is advantageous to have sloped sidewalls. The article by Bondur and Clark in Solid State Technology, page 122, April 1980, describes a process for obtaining via holes with sloped walls in $SiO_2$ layers. The process is obviously very different from that of the present invention. The present process is more convenient, and also more convenient than any conventional process involving wet development with alkaline solutions.

DISCLOSURE OF THE INVENTION

According to the present invention, via holes having sloped sidewalls are formed by a completely dry process. The process comprises the steps of (1) covering the substrate with an organic polymer film; (2) positioning a mask above the organic polymer film at a distance of about 20 to 200 microns. This positioning distance is a critical feature of the invention. The next step in the process is exposing the polymer film to oxygen reactive ion etching through the mask. The mask is made of any material impervious to reactive ion etching, but the mask has perforations therethrough. These perforations are generally from about 1 to 15 microns in diameter, preferably about 5 microns. The exposure to reactive ion etching continues until holes are etched through the polymer film in registration with the perforations in the mask.

Any organic polymer may be used to form the film used in the present process. May such materials are known, for example, those used as resist materials. Particularly good results have been obtained when the organic film is a polyimide.

The mask may be of any material impervious to the oxygen reactive ion etching. One such preferred material is silicon, particularly silicon (100) such as is found in stencil masks. The mask thickness is not critical, but good results have been obtained with masks of from about 2 to 5 microns in thickness.

As mentioned above, control of the gap between the polymer film and the mask is a critical feature of the present invention. As this gap in increased, the slope of the wall becomes greater. Conversely, as it is decreased, the slope becomes less. As is shown in the control experiment below, when there is no gap at all, that is, when the mask is in contact with the polymer films, sloped walls are not obtained at all. Under these circumstances the wall angle is 90°. The most preferred distance between the mask and the polymer film is from 50 to 100 microns.

The following experiments demonstrate the process for carrying out the present invention. In the first experiment, the mask is in contact with the polymer film, i.e., the gap is zero and under these circumstances a 90° wall angle results. Examples 1, 2 and 3 below show the operation of the present invention to obtain the desired sloped wall angles. The experiments were all conducted using silicon (100) stencil masks.

Control

Zero gap with an oxygen etch barrier:
RIE conditions
$O_2$ 150 micro (0.15 Torr) 10 sccm
−300 Volt bias potential
Substrate temperature 65° C.
Result: 90° wall angle for polyimide patterns.

EXAMPLE I

200 μm gap between a stencil mask and polyimide films
$O_2$ 150 micron (0.15 Torr) 10 sccm
−300 Volt bias potential
Substrate temperature 65° C.
Result: 35° wall angle for polyimide patterns.

EXAMPLE II

40 μm gap between a stencil mask and polyimide films
$O_2$ 60 micron (0.06 Torr) 4.2 sccm
−500 Volt bias potential
Substrate temperature 65° C.
Result: 60° wall angle for polyimide patterns.

EXAMPLE III

200 μm gap between a stencil mask and polyimide films
$O_2$ 60 micron (0.06 Torr) 4.2 sccm
−475 Volt bias potential
Substrate temperature 65° C.
Result: 40° wall angle for polyimide patterns.

I claim:

1. A completely dry process for forming via holes having sloped sidewalls, said process comprising the steps of:
   (1) covering a substrate with an organic polymer film,
   (2) positioning a mask above the organic polymer film at a distance of from 20 to 200 microns, and
   (3) exposing said polymer film to oxygen reactive ion etching through said mask, which has perforations therethrough, but which is otherwise impervious to the oxygen reactive ion etching, until holes are etched through the polymer film in registration with the perforations in the mask.

2. A process as claimed in claim 1 wherein the distance between the polymer film and the mask is from 50 to 100 microns.

3. A process as claimed in claim 1 wherein the organic polymer film is a polyimide.

4. A process as claimed in claim 1 wherein the mask is made of silicon.

5. A process as claimed in claim 1 wherein the mask is from about 2 to about 5 microns thick.

6. A process as claimed in claim 1 wherein the perforations in the mask are from 1 to 15 microns in diameter.

* * * * *